Sept. 25, 1973 K. A. PREOBRAZHENTSEV ET AL 3,761,310
METHOD OF OBTAINING CONTACT BETWEEN ELECTRODE
METAL AND SEMICONDUCTOR MATERIAL
Filed May 26, 1971 2 Sheets-Sheet 1

United States Patent Office 3,761,310
Patented Sept. 25, 1973

3,761,310

METHOD OF OBTAINING CONTACT BETWEEN ELECTRODE METAL AND SEMICONDUCTOR MATERIAL

Konstantin Andreevich Preobrazhentsev, ulitsa Narodnogo opolchenia 16, korpus 3, kv. 8, and Vsevolod Sergeevich Shvarov, Babiegorodsky pereulok 12, kv. 19, both of Moscow, U.S.S.R.;

Continuation-in-part of application Ser. No. 91,259, Nov. 16, 1970, which is a continuation of application Ser. No. 693,772, Dec. 27, 1967, both now abandoned. This application May 26, 1971, Ser. No. 147,000
Int. Cl. B44d 1/14, 1/18
U.S. Cl. 117—217 2 Claims

ABSTRACT OF THE DISCLOSURE

A method of making a contact between an electrode metal, such as gold or silver, and silicon in the manufacture of semiconductor devices, by coating the silicon surface with intermediate thin layers of an active metal, such as titanium, and a corrosion-resistant metal, such as nickel. The silicon surface is held at a temperature sufficient to cause the titanium to reduce the silicon oxides on the silicon surface. The total thickness of the titanium and nickel layers does not exceed 1,000 A. The thus metallized silicon is then fused with the electrode metal (silver or gold) at a temperature at which a eutectic liquid phase is formed.

CROSS RELATED APPLICATION

The present application is a continuation-in-part of Ser. No. 91,259 filed Nov. 16, 1970, now abandoned, which in turn was a continuation of Ser. No. 693,772 filed Dec. 27, 1967, now abandoned.

BACKGROUND

Field of the invention

The present invention relates to methods of manufacturing semiconductor devices and, in particular, to methods of making fused contacts between the metal and a semiconductor material.

For a better understanding of the specification we think it necessary to explain some terms we introduce into the text.

A "continuous fusion-in front" implies the absence of patches of the semiconductor wafer surface under the electrode metal due to the lack of complete wetting where no fusion occurs.

The term "subsequent crystallization" is employed in the reference to cooling the electrode metal-semiconductor metal so that the excess portion of semicondctor material separates from the melt and the melt of eutectic composition completely solidifies at the eutectic temperature.

Prior art

Widely known in the art are methods of joining semiconductor material with an electrode metal by fusing the metal with a surface of the semiconductor, at a temperature not lower than the eutectic temperature. As an example we would like to refer to the methods of making an ohmic contact by fusing silicon with an electrode by means of intermediate plates of gold and its alloys (see U.S. Pat. No. 3,050,667 and French Pat. No. 1,374,183).

Herewith it has been a general tendency to obtain ohmic contacts featuring ruggedness and high electrical properties.

U.S. Pat. No. 3,300,340 to Calondrello et al. discloses an improved method of producing a fused contact between the electrode metal and semiconductor material.

The method is performed by directly coating the surface of a semiconductor silicon wafer with a layer of the electrode metal (gold) and then with a layer of conductive metal, such as nickel. The structure thus obtained is heated to a temperature of 500° C., i.e. in excess of the temperature of the silicon-gold eutectic which is known to be produced at 377° C.

The final result, therefore, is, a fused contact of silicon, gold and nickel.

U.S. Pat. No. 3,300,340 is aimed at reducing the life of minority carriers and preventing considerable heterogeneity of gold in silicon.

The above mentioned methods of obtaining fused contacts as well the method taught in Pat. No. 3,300,340 have a number of disadvantages. In those methods silicon is fused immediately with an electrode metal (gold). As is known, the liquid state of the combination of gold and silicon is formed at a temperature of approximately 377° C. Known is also the fact that gold is an element that is quick to dissolve silicon. Besides, consideration should be taken of the fact that under usual conditions a silicon surface is generally coated with a film of silicon oxide.

The surface tension of silicon dioxide is approximately half that of silicon, for example at a temperature from 600° C. to 800° C. it is about 300 dynes per cm. for silicon dioxide and about 600 dynes per cm. for silicon. The surface tension of almost all metals is larger than that of silicon oxide and smaller than that of silicon. Therefore, molten metal wet silicon well but does not wet silicon dioxide. The presence of silicon dioxide on the surface of silicon hampers wetting and uniform fusion (Henkels, H. W., The Fused Silicon Rectifier, Trans. AIEE, pt. 1, Communication and Electronics, 1957, vol. 75, No. 28). Therefore the obtention of a continuous and uniform fusion-in front of gold into silicon is rather complicated.

As is known, the obtention of rugged fusion-type rectifying and non-rectifying contacts with high electrical characteristics depends upon the degree of the uniform and continuous boundary between solidus and liquidus which has been obtained. The presence of a considerable amount of dissolubility of silicon at the eutectic point may cause non-uniform fusing.

Mention should also be made that gold as well as nickel are not active metals i.e. metals capable of reducing silicon oxide.

Therefore a gold-coated silicon wafer is to be heated to a temperature, at which the oxide film on the semiconductor surface is destroyed. Such a temperature surpasses the eutectic point of gold and silicon. It is precisely in this moment, due to distortions of oxide film at some points, that both elements will contact each other and a rapid dissolution of silicon and formation of liquid phase will commence. As from the very beginning of the dissolution process dissolubility of silicon in the liquid phase is high and an interrupted curved fusion front results with a maximum fusion depth at the points where the oxide film proves to be destroyed earlier than in other places. The process of rectification of the fusion front and joining separate wetted portions together (when the area is large and the electrode sufficiently thick) may occur when the fusion goes to deep, but even in this case the whole of the surface will not be wetted.

The layer of nickel deposited upon the layer of gold dissolves in the liquid phase of the eutectic composition of silicon and gold and does not affect the geometry of the fusion front.

U.S. Pat. No. 2,874,341 to Biondi et al. is directed to a method of producing a fused contact between the electrode metal and semiconductor material, in which to avoid the above drawbacks in the process of fusing an electrode metal with semiconductor material, a high-heat mixture containing an active metal is used.

The Biondi method is performed by directly coating the surface of a semiconductor silicon wafer with a high-heat mixture comprising a fusing agent selected from the group of hydrides of vanadium, thorium, tantalum, zirconium, niobium and titanium, and a high-heat agent selected from the group of tin, lead or lead-tin alloys.

Herewith, one of the metals of the above mentioned group seems to diffuse into the semiconductor material.

The Biondi method provides for coating the surface of a semiconductor silicon plate with a layer of a suspension comprising a hydride of an active metal, for example, titanium, as a fusing agent, and a definite proportion of a high-heat agent, such as tin.

The structure thus obtained is heated to a temperature above the decomposition point of the hydride applied and above the melting point of the high-heat agent, i.e., to about 900° C.

The final result is a fused contact of silicon, titanium and tin.

The object of Biondi is to produce low ohmic compound with a highly purified silicon and to improve the electric characteristics of silicon devices.

The fused contact produced by the method of Biondi has a number of disadvantages.

For carrying out this method, the semiconductor surface is coated with an electrode metal in the form of a high-heat mixture which is fused with the semiconductor at temperatures on the order of 900° C., i.e., the method cannot be employed for producing thin contact layers of electrode metal with a uniform fusion-in front over considerable areas, or for performing low-temperature fusing-in. An attempt has been made to solve the problem of producing a fused contact with a continuous and uniform fusion-in front on the basis of the methods that are taught in the U.S. Pat. Nos. 2,874,341 and 3,300,340.

To this end we have used a method, whereby an active metal is represented by a fusing agent in the form of a suspension selected from the hydride group of tantalum, titanium, columbium and zirconium (according to Biondi et al.), and the electrode metal, by nickel and gold according to Calondrello et al.

The semiconductor surface was coated with a layer of a fusing agent in the form of a suspension selected from the hydride groups, for example, titanium hydride.

The layer of a fusing agent, i.e., suspension of titanium hydride, was coated with a layer of gold and nickel.

The structure thus obtained on the basis of Calondrello et al. in view of Biondi et al., i.e. the structure comprising silicon-titanium hydride—a layer of gold—a layer of nickel, was heated, in accordance with the method of Biondi et al., to a temperature, at which the hydride of the fusing agent (tritanium) decomposes, i.e., to a temperature on the order of 500° C.

As soon as the hydride of the fusing (titanium) decomposes gaseous hydrogen is released and the layers of gold and nickel deposited will immediately separate from the layer of titanium hydride suspension. In this case it is impossible to fuse the electrode metal (gold) and nickel into silicon.

A direct contact has been produced between the electrode metal (gold or nickel) and the layer of hydride suspension of the fusing agent (titanium) on some wafers. According to Biondi et al., the fusing agent (titanium) is applied on the surface of silicon in the form of a suspension of hydride in the solution of nitrocellulose in amyl acetate.

If this technique were followed for depositing the fusing agent, the thickness of the layer of the fusing agent (titanium) reduced to an elementary form (after thermal decomposition and release of hydrogen, would considerably exceed 1,000 A. In other words, it is practically, as well as theoretically, impossible to obtain the layer of the fusing agent less than 1,000 A. thick using this technique for applying a fusing agent (titanium).

Another factor to be reckoned with is that the temperature at which a melt can be produced in the titanium-gold system lies above 1,000° C.

In this case it is also impossible to fuse the electrode metal (gold) into the semiconductor (silicon) at the gold-silicon eutectic temperature.

The mechanism of forming a fused contact is that tin initially dissolves the fusing agent obtained in an elementary form, and then a contact of the silicon-titanium-tin system is produced at a temperature on the order of 900° C., although tin has a fusing-in temperature of 232° C.

In order to fuse the electrode metal (gold) into the silicon with thick layers of the active metal (titanium), the structure obtained must be heated to a gold fusing temperature so that gold can dissolve titanium and nickel and fuse in the silicon.

The contact thus obtained will be a system of silicon, titanium, gold and nickel.

It may be concluded on the basis of the above-mentioned patents that whatever succession of operations were followed in accordance with the reference patents there cannot be obtained a continuous and uniform fusing-in front of the electrode metal in the semiconductor.

SUMMARY OF THE INVENTION

An object of the present invention is to eliminate the above mentioned drawbacks of the methods of making fused contacts between a metal electrode and a semiconductor materials.

A further object of the invention is to produce a uniform, continuous and shallow fusion-in front of metal electrode and semiconductor material.

A further object of the invention is to form a fused contact of the desired size and shape between an electrode metal and semiconductor.

A still further object of the invention is to provide a method of producing semiconductor devices having more rugged fused contacts with higher electrical properties.

For attaining these objects the method according to the present invention provides for the successive application, directly on the semiconductor surface by thermal evaporation in vacuum, of a layer of essentially pure active metal of a thickness less than 1,000 A. selected from the group comprising tantalum, titanium, chromium, niobium and zirconium at a temperature of the semiconductor sufficient for reducing oxides on its surface, resulting in the separation of elementary semiconductor and conversion of an essentially larger part of the active metal layer into an oxide of the active metal, said metal being then coated with a layer of electrode metal which is fused in the semiconductor at a temperature not less than that of the electrode metal-semiconductor eutectics so that an essentially greater part of the active metal oxide is separated on the surface of the electrode metal-semiconductor melt in the form of slag intrusions, the resultant structure being then cooled to room temperature.

When performing the proposed method, the surface of silicon or germanium heated up to 300° to 700° C. is coated with an active metal layer. Thereafter in the temperature range of from 100° to 700° C. a layer of gold or silver is applied thereon and fusing-in of gold or silver in the silicon or germanium is carried out in the temperature range from 300° to 1200° C.

In making a fused contact whose area exceeds that of the applied electrode metal, the above-mentioned layer of active metal is successively coated with a layer of corrosion-resistant metal selected from the group comprising gold, nickel and silver to protect the above-mentioned semiconductor surface against oxidation by the environment after the application of an active metal layer, the total thickness of the layers applied not being in excess of 1,000 A., said layer of corrosion-resistant metal being coated with an electrode metal which is fused in the semiconductor material at a temperature that is not below the eutectic point of the electrode metal-semiconductor, so that an essentially greater part of the active metal oxide is separated on the surface of the electrode metal-semiconductor melt in the form of slag intrusions, the resultant structure being then cooled to room temperature.

When performing the proposed method, the surface of silicon or germanium, heated to 300° to 700° C. is coated with an active metal layer. Thereafter in the temperature range of from 100° to 700° C. a layer of corrosion resistant metal is applied, upon which an electrode metal (gold, silver) is disposed. The fuse-in process of gold or silver in silicon or germanium is performed in the temperature range from 300° to 1200° C. By proper choice of electrodes to be fused both rectifying and nonrectifying contacts may be produced.

According to the above method, a thin layer (less than 1,000 A. thick) of an essentially pure active metal selected from the above-mentioned group of metals, for example, titanium, is applied on the semiconductor surface. The titanium layer is coated on the surface of a preheated semiconductor (silicon) at a temperature sufficient to reduce silicon oxide on its surface in a temperature range from 300° to 700° C. A titanium layer is applied on the semiconductor surface by thermal evaporation in vacuum.

One of the embodiments of the method provides for a successive application of a layer of active metal and a layer of corrosion-resistant metal, such as nickel, the total thickness of the layers applied not being in excess of 1,000 A.

The resultant structure is heated to a temperature not less than the eutectic temperature of the electrode metal-semiconductor. The final product is a fused contact of silicon and gold, gold being applied either on the titanium layer or on the nickel layer depending upon the particular embodiment of the invention.

For a better understanding of the mechanism of a fused contact formation produced in accordance with the present method, the following description will be given with reference to a silicon-gold contact embodiment obtained with the use of intermediate films of titanium or titanium and nickel.

DETAILED DESCRIPTION

Figure 1:
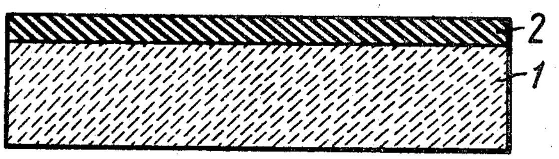
FIGS. 1–4 are sectional views which show the steps of the silicon-gold melt formation in the process of fusing gold with silicon through an intermediate layer (less 1,000 A. of titanium.

A residual silicon oxide film is known to be always present on the surface of silicon under regular conditions (in FIG. 1, numeral 1 designates a monocrystalline silicon substrate and numeral 2 a residual oxide film).

The residual oxide film on the surface of the silicon substrate prevents the fusing-in of the electrode material into the silicon and makes it practically impossible to obtain a thin and uniform fusing-in front of the electrode metal, while also precluding low-temperature fusing.

The method of the invention is based on the fact that certain materials (referred to as an "active metal" in this application) can, at definite temperatures, react with silicon oxide resulting in the separation of elementary silicon and oxidation of the active metal. The reduction of silicon oxide by titanium ($SiO_2+Ti \rightarrow TiO_2+Si$) takes place at 400° C.

Therefore, in order to reduce and destroy the continuous residual silicon oxide layer on the surface of the silicon substrate, the active metal must be applied at such a temperature of the substrate as to stimulate the reduction of the residual silicon oxide film. Since the active metal in accordance with the present invention has to reduce and destroy the continuous residual oxide film, it will be easily understood that the quantity of titanium applied must be sufficient to reduce the oxide film.

As the active metal is applied on a heated substrate by thermal evaporation in vacuum, the reduction process of the oxide film starts immediately upon contact of the active metal applied and the residual oxide film. Under the influence of the active metal, the residual oxide film disappears, being converted into the reaction products of the active metal and the oxide film, namely, oxidized active metal (titanium dioxide) and elementary silicon.

Figure 2:
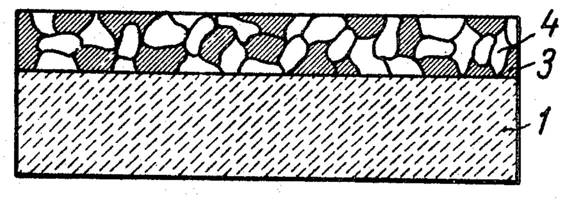

The structure of the resultant layer is shown in FIG. 2, in which numeral 3 designates the oxide of the active metal (titanium dioxide) that has formed on the surface, and numeral 4 designates the separated silicon.

The above mechanism of destruction of silicon oxide film has been confirmed by corresponding electronographic and electron-microscopic investigations.

It is to be noted that the drawings are only diagrammatic, serving to facilitate an understanding of the respective processes.

After the active metal has been applied and the oxide film destroyed, the substrate is heated to a temperature allowing application of an electrode metal e.g. gold. Titanium and gold are deposited in the same vacuum apparatus during one cycle.

After gold has been deposited, it is fused in the bulk of the semiconductor (silicon) at a temperature not less than that at which a gold-silicon melt of eutectic composition is formed.

Figure 3:
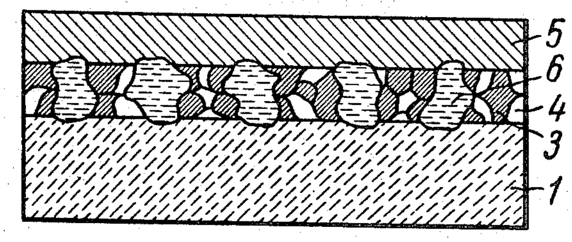

As the eutectic temperature of the silicon-gold melt is reached, the melt starts to acquire a eutectic composition. At the initial phase, the gold-silicon melt is formed not from the substrate material but rather from the elementary silicon that has separated through the interaction of the active metal and the residual oxide film. By virtue of the gold dissolving the elementary silicon, characteristic channels of the gold-silicon melt are formed, which stimulate dissolution of the semiconductor material of the substrate. In FIG. 3, numeral 5 represents the gold, and 6 represents the gold-silicon melt channels.

After a certain time period, the channels merge and the applied gold fully dissolves in the silicon, producing a uniform gold-silicon melt.

It will be observed that the channels of the gold-silicon melt are so close to one another that the gold is practically fused in the silicon across the entire surface at the same time.

Possessing a smaller density than the gold-silicon melt, titanium oxide emerges above the surface of the melt as a slag intrusion.

Figure 4:
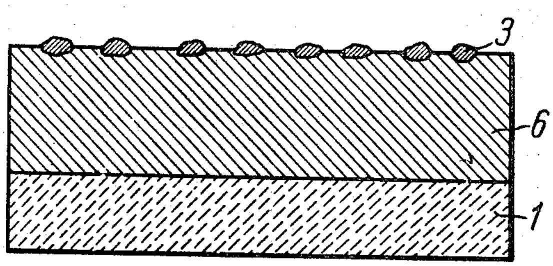

FIG. 4 shows the final state of the gold fusing in silicon, and the slag intrusions in the form of titanium oxide on the surface of the melt.

After fusing-in has been performed and the temperature reduced, excess silicon melted during the fusing-in process separates and the residual eutectic melt solidifies.

In order to separate the process of titanium deposition and application of gold, the present method provides, after the active metal has been deposited, for the application of a protective corrosion-resistant metal, such as nickel. Nickel is applied to protect the semiconductor surface, ready for a fusing-in process, against oxidation by the environment, i.e., a nickel coating having been applied, the treated plate can be taken out of the vacuum apparatus and other operations required by the production process are performed.

When gold is applied, for example, by a galvanic method on the layer of a corrosion-resistant metal (nickel) and the structure is heated to the silicon-gold eutectic temperature, the first stage is the diffusion of silicon (separated through the decomposition of the residual silicon oxide film by the active metal) into the nickel layer. This observation has also been confirmed by the corresponding electronographic and electron-microscopic investigations.

When the diffused silicon emerges on the outer surface of the nickel layer (the dividing surface between the electrode metal and the protective metal) and enters into contact with gold, this results in the formation of a gold-silicon-nickel melt of eutectic composition and channels similar to those considered above.

At the next stage the channels fully merge and gold and nickel are completely dissolved in silicon.

Figure 5:
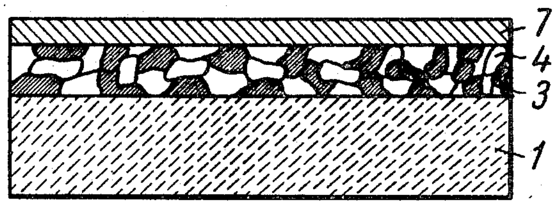
FIGS. 5–7 show the steps of the silicon-gold melt formation through intermediate thin layers of titanium and nickel (total thickness not exceeding 1,000 A.).
Figure 6:
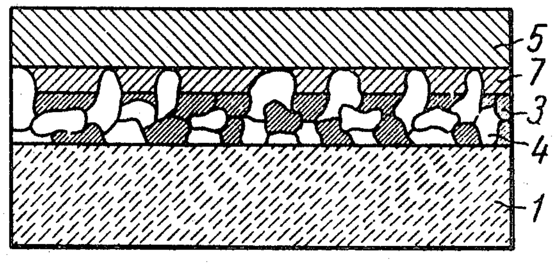
Figure 7:
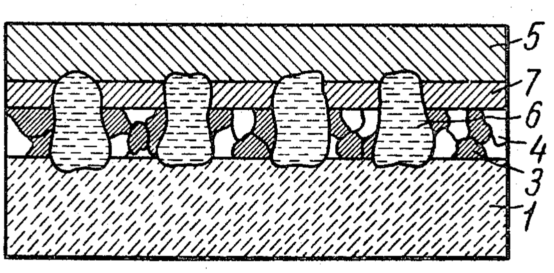

Consequently, the method of fusing in of the electrode metal (gold) through layers of nickel and titanium comprises the following steps:

(a) applying titanium on the silicon surface (FIG. 2);
(b) applying nickel (FIG. 5, in which numeral 7 designates a layer of corrosion resistant metal i.e. nickel);
(c) depositing gold and heating the resultant structure to the gold-silicon eutectic temperature, resulting in the diffusion of silicon obtained through the interaction of titanium and silicon oxide into the nickel layer (FIG. 6);
(d) formation of channels of the gold-silicon-nickel melt of eutectic composition (FIG. 7); and
(e) merging of channels and complete dissolution of gold and nickel in silicon.

As in the previous example, titanium oxide emerges on the surface of the melt as a slag intrusion.

Active metal is used in the above method for reducing and destroying the residual oxide film only. When an active metal is deposited on the semiconductor substrate heated to a temperature provoking interaction between the active metal and the silicon oxide film, the silicon oxide film on the semiconductor surface is reduced to elementary silicon and the active metal is oxidized (FIG. 2).

The quantity of active metal deposited on the semiconductor substrate surface must be sufficient to effect complete reduction of the oxide film. If this condition is observed, all the active metal interacts with the semiconductor oxide film, the products of their interaction, i.e., elementary silicon and an oxide of the active metal emerging on the semiconductor surface.

The method allows the presence of unbound active metal on the semiconductor surface in certain quantities owing to the fact that some extra active metal is applied which does not interact with the residual oxide film. It is obvious that in this case the quantity of the unbound active metal is negligible compared with the total mass of the electrode metal-semiconductor (gold-silicon) melt and that it is dissolved at a later stage when the electrode metal is fused in the semiconductor.

During a preferable deposition process, the active metal fully interacts with the residual oxide film which is present on the semiconductor surface. In this case titanium, as such, is not found in the electrode metal-semiconductor melt. What is found is a product of interaction of the active metal, in particular, titanium oxide which is present as a slag intrusion on the surface of the electrode metal-semiconductor melt.

A certain amount of unbound active metal is acceptable in the electrode metal-semiconductor melt (in particular, titanium in the gold-silicon melt), this amount being so negligible as compared with the total mass of the electrode metal-semiconductor melt that, it may be asserted that, whatever quantity of titanium there is in the melt it does not represent a part of the electric contact with the semiconductor. Owing to its small quantity, titanium does not separate as an independent phase during the solidification of the melt, producing a solid solution with the principal components of the fused contact, silicon and gold. Titanium cannot constitute a part of the ohmic contact because of its small quantity in much the same manner as, for example, gold added to the semiconductor for reducing the life of minority carriers during the growth of a semiconductor crystal (gold concentration of $10^{15}$ cm.$^{-3}$) is not considered to be a material of the fused contact. Gold in this case does not separate as an independent phase, but rather forms a hard solution of silicon. Gold, therefore, is not regarded as a material of the contact or a part thereof.

A corrosion-resistant metal, such as nickel, although present in the electrode metal-semiconductor melt, does not separate as an independent phase during melt crystallization owing to its small quantity.

It should be pointed out that the thickness of the active metal deposited on the semiconductor surface or the total thickness of the active metal and the corrosion-resistant metal is less than 1,000 A., i.e., their quantity is very small.

Thus the above leads to the conclusion that:

(1) The selection of active metals, for example, titanium for carrying out the proposed method, is connected with the fact that these metals are only added for reducing and destroying the residual oxide film of the semiconductor (silicon).

(2) The quantity of an active metal, for example, titanium, coated on the semiconductor surface must be such (less than 1,000 A. thick) as to ensure reduction of the residual oxide film of the semiconductor (silicon) only.

(3) Owing to the interaction of the above metal, for example, titanium, with the residual oxide film of the semiconductor (silicon), elementary silicon and an oxide of the active metal will be obtained on the semiconductor surface.

(4) The proposed method of contact formation is carried out with the help of essentially pure active metal coated by thermal evaporation of the active metal in vacuum over the entire surface of the semiconductor plate as required.

(5) The proposed method does not preclude the presence of a certain excess amount of active metal that has not interacted with the residual oxide film, but this excess amount must be very small compared with the total mass of the electrode metal-semiconductor melt.

(6) In carrying out the present method of producing a fused contact, the active metal that has been involved in the reaction (oxide of the active metal) emerges in the form of a slag instrusion on the surface of the electrode metal-semiconductor melt.

(7) In carrying out the present method it is not desirable to use suspensions of hydrides of the active metals. In this case when a protective corrosion-resistant metal is coated in layers by thermal evaporation in vacuum, or by other methods (for example, galvanizing) hydrogen is released upon hydride decomposition and the layers of the corrosion-resistant and electrode metals are separated from the fusing agent.

(8) When a suspension of a fusing agent is employed, the layer of active metal turns out to be considerably thicker than 1,000 A., inhibiting the fusing-in of the electrode metal at the eutectic temperature of the electrode metal-semiconductor.

(9) If a thick layer of active metal is deposited on the semiconductor surface, the electrode metal can be fused in the semiconductor only if the electrode metal is melted, i.e., at high temperatures, which will, in the case of gold, cause considerable non-uniformity of the fusing-in front and make the fusing-in process uncontrollable.

(10) Since, according to the proposed method, the semiconductor surface is coated with thin layers of active and protective metals (total thickness not in excess of 1,000 A.) and the active metal interacts with the residual oxide film, the quantity of the active and corrosion-resistant metals is very small in the electrode metal-semiconductor melt, as well as in the resultant fused contact. The active and corrosion-resistant metals are present in the fused contact, but do not form a part thereof or produce contact with the semiconductor.

When making silicon or germanium semiconductor devices, for obtaining ohmic contact it is most expedient that the surface of the semiconductor materials be coated with thin films of titanium and nickel by the method of vacuum evaporation, the total thickness of said films being less than 1,000 angstroms, with a subsequent fusing of metallized crystals with gilded electrodes. This insures the obtaining of fusion over any area with a small depth of fusion, and a uniform front of fusion-in with minimum thickness of the electrode material. Both fused contact and the connection of a gilded lead-out electrode without recourse to any shims may be made. A fused contact whose strength equals that of the semiconductor material, with a structure resistant to any etching agents can be made. A rugged low-ohmic fused contact on any surface of the semiconductor material worked or polished by mechanical or chemical methods can be produced; the process of fusion may be carried out either in vacuum, in a hydrogen atmosphere, or in a stream of an inert gas and even in air; the same electrodes may be used for making contact with n- and p-diffusion layers of the crystals.

For a better understanding of the present invention, given hereinbelow is a description of an exemplary application of the method for obtaining an ohmic contact when making a low-power silicon diffusion mesa-diode.

The diode is obtained as follows.

Silicon wafers of n-type conductivity with a resistivity of about 5 ohm/cm. are polished and etched on both sides to a thickness of 250 microns. Then, phosphorus from the vapors of $P_2O_5$ and boron from the vapors of $B_2O_3$ are prediffused in succession. After that, diffusion of phosphorus and boron is effected for 20 hours at 1,250° C. After the diffusion, the depth of the p-n junction is approximately 60 microns, and the thickness of the diffusion $n^+$ layer is about 80 microns. The surface concentration on the p-type side is of the order of $10^{19}$ cm.$^{-3}$, and that on the n-type side is of the order of $5\times10^{19}$ cm.$^{-3}$. Then, the surface is cleaned by etching in a mixture of nitric, hydrofluoric and acetic acids to a depth of about 2 to 5 microns.

On both sides of the silicon wafer thus cleaned, films of titanium are applied, the temperature of the base being of the order of 500° C., in a vacuum of $10^{-5}$—$5.10^{-5}$ mm. Hg. The thickness of the titanium film should be 400–450 angstroms.

Other metals, chosen from the previously defined group may also be applied.

To protect the semiconductor surface against oxidation by the environment after the application of the layer of titanium, a layer of a corrosion-resistant metal, such as nickel or silver, is successively applied by evaporating with a thickness approximately equal to that of the titanium film.

The plates thus metallized are used for making mesa-structures.

The surface of the wafer is coated with a layer of a protective acid-proof varnish, said varnish being applied through a mask with round openings 1 mm. in diameter. The varnish is dried and the silicon wafer is immersed in an etching composition of nitric, hydrofluoric and acetic acids. The wafer is etched as thick as 150 microns and then washed in water, in toluene, and dried. Having been dried, the wafer is divided into separate pieces, which may be fused with load-out electrodes of any known construction. The lead-out electrodes made of silver are electrolytically coated with a layer of nickel 2–3 microns thick and with a layer of gold 5–6 microns thick. The fusion is effected in a jig which insures the pressure on an electrode-crystal-electrode system not less than 1 g./mm.$^2$ in a vacuum of the order of $10^{-4}$ mm. Hg, at a temperature at the jig of 480–500° C., this temperature being maintained for 5–1 min. in the case of the titanium-nickel metallization.

If other metallizing coatings are used, the temperature of fusion should not be below the eutectic temperature of the fusion-in electrode and semiconductor material.

After fusing-in of the gold coating of the lead-out electrode through the titanium and nickel layers, due to the wetting and deliquescence of the eutectic mixture gold-silicon, fused contact is obtained over the entire diameter of the crystal. The front of fusing-in is uniform and penetrates the wafer as deep as 5–10 microns.

The diode thus assembled is slightly etched in a mixture of acids, for example hydrofluoric and acetic acids, for 30 sec. and thoroughly washed in deionized water. After drying at a high temperature in the oxygen atmosphere, a diode is coated with a thin layer of silicone rubber. On completion of polymerization of the silicone rubber, the diode is coated with a drop of an epoxy siloxane compound. This coating polymerizes at a temperature of about 200° C.

The realization of the method of the present invention makes it possible to obtain a low-power silicon diffusion mesa-diode with good electrical and mechanical characteristics and also to reduce the cost of manufacture of semiconductor devices by about 30 percent owing to the improved reliability of the contact, simplified design of the equipment and increased percentage of yield of the finished product.

What is claimed is:

1. A method of forming contact between an electrode metal and a semiconductor material, comprising the steps of coating a semiconductor surface of silicon or germanium with a layer of titanium, the temperature of the semiconductor material being sufficient to reduce the oxides on the semiconductor surface to the elemental semiconductor material and to cause an essentially greater part of the titanium to become titanium oxide, coating said elemental semiconductor material and said titanium oxide with a layer of a corrosion-resistant metal selected from the group consisting of nickel and silver to prevent the semiconductor surface with the elemental semiconductor material and the titanium oxide from undergoing oxidation, the total thickness of said layers not exceeding 1,000 A.; depositing silver as an electrode metal on said layer of corrosion-resistant metal and fusing said electrode metal into said semiconductor material at a temperature not less than the eutectic temperature of the silver-semiconductor liquid phase, so that an essentially greater part of the titanium oxide emerges on the surface of the silver-semiconductor melt in the form of slag inclusions, and cooling the resultant structure to room temperature.

2. A method of forming contact between an electrode metal and a semiconductor material, comprising the steps of coating a semiconductor surface of silicon or germanium with a layer of titanium, the temperature of the semiconductor material being sufficient to reduce the oxides on the semiconductor surface to the elemental semiconductor material and to caust an essentially greater part of the titanium to become titanium oxide, coating said elemental semiconductor material and said titanium oxide with a layer of a corrosion-resistant metal selected from the group consisting of nickel and silver to prevent the semiconductor surface with the elemental semiconductor material and the titanium oxide from undergoing oxidation, the total thickness of said layers not exceeding 1,000 A.; depositing gold as an electrode metal on said layer of corrosion-resistant metal and fusing said electrode metal into said semiconductor material at a temperature not less than the eutectic temperature of the gold-semiconductor liquid phase, so that an essentially greater part of the titanium oxide emerges on the surface of the gold-semiconductor melt in the form of slag inclusions, and cooling the resultant structure to room temperature.

References Cited

UNITED STATES PATENTS

| | | | |
|---|---|---|---|
| 3,445,727 | 5/1969 | Maple | 317—235 M |
| 2,973,466 | 2/1961 | Atalla et al. | 117—217 |
| 3,442,701 | 5/1969 | Lepselter | 117—221 |

CAMERON K. WEIFFENBACH, Primary Examiner

U.S. Cl. X.R.

117—221; 317—234 L, 234 M